United States Patent [19]
Sasaki et al.

[11] Patent Number: 5,717,709
[45] Date of Patent: Feb. 10, 1998

[54] SEMICONDUCTOR LIGHT-EMITTING DEVICE CAPABLE OF HAVING GOOD STABILITY IN FUNDAMENTAL MODE OF OSCILLATION, DECREASING CURRENT LEAKAGE, AND LOWERING OSCILLATION THRESHOLD LIMIT, AND METHOD OF MAKING THE SAME

[75] Inventors: Kazuaki Sasaki, Yao; Osamu Yamamoto, Nara, both of Japan

[73] Assignee: Sharp Kabushiki Kaisha, Osaka, Japan

[21] Appl. No.: 668,086

[22] Filed: Jun. 19, 1996

Related U.S. Application Data

[63] Continuation of Ser. No. 253,363, Jun. 3, 1994, abandoned.

[30] Foreign Application Priority Data

Jun. 4, 1993 [JP] Japan ................................ 5-134449
Feb. 15, 1994 [JP] Japan ................................ 6-018500

[51] Int. Cl.⁶ ............................................ H01S 3/18
[52] U.S. Cl. ............................... 372/46; 372/48
[58] Field of Search .................... 372/46, 48; 257/98

[56] References Cited

U.S. PATENT DOCUMENTS

| | | |
|---|---|---|
| 3,920,491 | 11/1975 | Yonezu . |
| 4,321,556 | 3/1982 | Sakuma . |
| 4,326,176 | 4/1982 | Aiki et al. . |
| 4,545,057 | 10/1985 | Hayakawa et al. . |
| 4,716,129 | 12/1987 | Taneya et al. . |
| 4,817,104 | 3/1989 | Taneya et al. ................. 372/48 |
| 4,990,972 | 2/1991 | Satoh et al. . |
| 5,023,198 | 6/1991 | Strege . |
| 5,079,185 | 1/1992 | Kagawa et al. . |
| 5,089,437 | 2/1992 | Shma et al. . |
| 5,111,471 | 5/1992 | Hattori . |

FOREIGN PATENT DOCUMENTS

| | | | |
|---|---|---|---|
| 0342983 | 11/1989 | European Pat. Off. . | |
| 0351839 | 1/1990 | European Pat. Off. . | |
| 0395436 | 10/1990 | European Pat. Off. . | |
| 3827961 | 3/1989 | Germany . | |
| 60-0130882 | 7/1985 | Japan | 372/46 |
| 60-130882 | 7/1985 | Japan . | |
| 61-281562 | 12/1986 | Japan | 257/98 |
| 04-369882 | 12/1992 | Japan . | |
| 4-369882 | 12/1992 | Japan | 372/46 |
| 2247347 | 2/1992 | United Kingdom . | |

OTHER PUBLICATIONS

Dzurlo et al., "MOCVD growth of AlGaAs/GaAs structures on nonplanar [111] substrates: Evidence for lateral gas phase diffusion" *Journal of Electronic Materials* (1990) 19(12):1267–1372. (no month available).

Lee et al., "Buried–ridge striped planar GaAlAs/GaAs lasers with of wide range a effective index steps" *Applied Physics Letters* (1990) 56(7):599–601. (Feb. 12).

Yamaguchi, K. et al., "Lateral growth on [111]B GaAs substrates by metalorganic chemical vapor deposition" *Journal of Crystal Growth* (1989) 94:203–207. (no month available).

*Primary Examiner*—Rodney B. Bovernick
*Assistant Examiner*—Yisun Song
*Attorney, Agent, or Firm*—Morrison & Foerster

[57] ABSTRACT

A semiconductor laser device includes a substrate having one of p- and n-conductivity types, and a current constrictive layer formed on a surface of the substrate and having the other type of conductivity. The current constrictive layer has a through-channel extending to the surface of the substrate for defining a current path in a direction perpendicular to the surface of the substrate. The through-channel is of a belt-like pattern extending in a direction perpendicular to end surfaces of the substrate. A third cladding layer having the one type of conductivity is filled in the through-channel, a surface of the third cladding layer being flush with a surface of a current constrictive layer. A first cladding layer, an active layer, and a second cladding layer which constitute a double heterostructure are formed over the third cladding layer and current constrictive layer.

9 Claims, 6 Drawing Sheets

SEMICONDUCTOR LIGHT-EMITTING DEVICE CAPABLE OF HAVING GOOD STABILITY IN FUNDAMENTAL MODE OF OSCILLATION, DECREASING CURRENT LEAKAGE, AND LOWERING OSCILLATION THRESHOLD LIMIT, AND METHOD OF MAKING THE SAME

This application is a file wrapper continuation of application Ser. No. 253,363, filed Jun. 3, 1994, now abandoned.

BACKGROUND OF THE INVENTION

1. Field of the Invention

The present invention relates to semiconductor light-emitting devices and methods for making such devices. More particularly, the invention relates to a short wavelength semiconductor laser which emits light beams of red to orange colors and a light emitting diode (LED) having a wavelength band of red to green colors, and methods for making the same.

2. Description of the Prior Art

Recently, red semiconductor lasers having a wavelength band of 630 to 680 nm constructed of AlGaInP have been receiving attention as a promising source of light for POS, as well as for high definition, high density photomagnetic disks. Indeed, researches and developments have been made in this connection. When such laser is used for disks, fundamental mode stability and good optical characteristics such as astigmatism and so on, in particular are important. For this reason, there exists a need for a semiconductor laser of the refractive index guide type which confines light beams within the region of oscillation.

Refractive index guide type semiconductor laser devices of 680 nm wavelength band have hitherto been known including one shown in FIG. 11 which is of the effective refractive index guide type, and another shown in FIG. 12 which is of the real refractive index guide type. FIG. 11 is a sectional view showing the semiconductor laser device of the effective refractive index guide type, and FIG. 12 is a sectional view showing the semiconductor laser device of the real refractive index guide type. The semiconductor laser device shown in FIG. 11 is fabricated in such a way that on an n-GaAs substrate 131 having (100) face as a main face are grown an n-$(Al_{0.5}Ga_{0.5})_{0.5}In_{0.5}P$ cladding layer (1.5 μm thick) 133, a non-doped $Ga_{0.5}In_{0.5}P$ active layer (0.05 μm thick) 134, a p-$(Al_{0.5}Ga_{0.5})_{0.5}In_{0.5}P$ cladding layer (1.5 μm thick) 135, and a p-$Ga_{0.5}In_{0.5}P$ intermediate layer 136 according to a MOCVD (Metal Organic Chemical Vapor Deposition) process. Then, the intermediate layer 136 and an upper portion of the cladding layer 135 are removed by etching, leaving a centrally located ridge portion 141. Subsequently, n-GaAs current constrictive layers 132 are grown on both sides of the ridge portion 141 and, in addition, a p-GaAs contact layer 137 (2 μm thick) is grown over the entire region. Finally, electrodes 139, 140 are formed respectively on the underside of the substrate 131 and on the surface of the contact layer 137. In such a semiconductor laser, the current constrictive layers 132 limit current passage to decrease ineffective current and cause a substantially large mode loss relative to a higher order mode of oscillation. Thus, an oscillation mode of higher order is suppressed so that oscillation of the fundamental mode is steadily maintained in oscillation region 134a to a high light output.

The semiconductor laser device shown in FIG. 12 is fabricated in such a way that on a p-GaAs substrate 101 having (100) face is formed an n-GaAs current constrictive layer 102 in which a channel 102b is formed reaching from the surface of the layer 102 into the substrate 101. Then, a p-$(Al_{0.5}Ga_{0.5})_{0.5}In_{0.5}P$ cladding layer (1.8 μm thick) 103, a non-doped $Ga_{0.5}In_{0.5}P$ active layer (0.05 μm) 104, an n-$(Al_{0.5}Ga_{0.5})_{0.5}In_{0.5}P$ cladding layer (1.5 μm thick) 105, and an n-$Ga_{0.5}In_{0.5}P$ contact layer (1 μm thick) 106 are sequentially formed over the layer 102 according to the MOCVD process (where each layer thickness value denotes the thickness of the respective layer in the channel). Finally, electrodes 109, 110 are formed respectively on the underside of the substrate 101 and on the surface of the contact layer 106. In the stage of growth according to the MOCVD process, the layer being grown usually reflects the configuration of the base layer. Therefore, the active layer 104 is of such a configuration that it is largely bent above the edge of the channel 102b, that is, above corresponding ends of the current constrictive layer 102, whereby a real refractive index guide structure is formed. According to this arrangement, possible loss in the fundamental mode is reduced, which results in reduced threshold oscillation value and increased differential efficiency.

Unfortunately, however, the semiconductor layer shown in FIG. 11 involves a problem that the stability of the fundamental mode depends largely on the thickness (residual thickness) d of the cladding layer portions remaining at both sides of the ridge 141. This means that when etching variations are so wide that the residual thickness d substantially exceeds 0.3 μm, the fundamental mode is rendered unstable. (It is noted in this connection that an optimum value of residual thickness d is approximately 0.2 μm.) The same is true with the case in which residual thickness d differs on opposite sides of the ridge 141. Another problem is that in the stage of current constrictive layer 132 growing, the base layer for such growth is a layer including Al, that is, the p-$(Al_{0.5}Ga_{0.5})_{0.5}In_{0.5}P$ layer 135, which fact is likely to be a cause of oxidation so that the quality of a regrown interface 135a will be unfavorably affected. This results in current leaks which in turn lead to an increase in the oscillation threshold value. Typically, a non-coated device having a resonator length of 400 μm has an oscillation threshold value of 45 mA and a kink level of about 25 mW.

The semiconductor laser device shown in FIG. 12, wherein the active layer 104 is largely bent at ends of the current constrictive layer 102 to provide a real refractive index guide construction, has smaller losses in both fundamental and higher order modes. This presents a problem that the kink level becomes rather lowered. Typically, a non-coated device having a resonator length of 400 μm has an oscillation threshold value of 25 to 30 mA and a kink level of about 20 mW.

SUMMARY OF THE INVENTION

The object of the present invention is therefore to provide a semiconductor light-emitting device having a current constrictive layer which has improved performance characteristics, and a method of making the same. Semiconductor light-emitting devices to which the invention is directed include, in particular, semiconductor laser devices and light-emitting diodes.

In order to achieve the aforementioned object, there is provided a semiconductor light-emitting device including a substrate having one of p- and n-conductivity types, a current constrictive layer formed on a surface of the substrate and having the other of the p- and n-conductivity types, the current constrictive layer having at least one through-channel extending to the surface of the substrate for defining a current path in a direction perpendicular to the surface of the substrate, and a double heterostructure formed on the current constrictive layer and including a first cladding layer, an active layer and a second cladding layer, characterized in that:

the through-channel is of a belt-like pattern which extends perpendicularly to end surfaces of the substrate; and the semiconductor light-emitting device comprises a third cladding layer having the one type of conductivity, at least one portion of the third cladding layer being filled in the through-channel, and the at least one portion of the third cladding layer having a surface flush with a surface of the current constrictive layer.

The semiconductor light emitting device includes the current constrictive layer formed on the surface of the substrate having one of the p- and n-conductivity types, the current constrictive layer having the other of the p- and n-conductivity types. The current constrictive layer has the through-channel of a belt-like pattern extending perpendicularly to the end surfaces of the substrate. Therefore, this semiconductor light-emitting device can constitute a refractive index guide type semiconductor laser device. The semiconductor laser device has the third cladding layer of the one conductivity type filled in the through-channel of the current constrictive layer, the surface of the third cladding layer being flush with the surface of the current constrictive layer. A first cladding layer, an active layer and a second cladding layer which constitute a double heterostructure are formed by a known growth method, for example, MOCVD process, flatly over the current constrictive and third cladding layers in a well-controlled manner, without involving any stage of etching. Therefore, the first cladding layer, active layer and second cladding layer involve almost no variation in thickness. This insures good stability in the fundamental mode of laser oscillation. The fact that no etching stage is involved after the formation of the third cladding layer eliminates the possibility of any growth interface being oxidized. This results in decreased current leakage and lowered oscillation threshold limit. The first cladding layer is usually designed to be relatively thin and in no case does this result in decreased higher-order mode loss. Therefore, good improvement is achieved in kink level. In this way, the semiconductor laser device having improved performance characteristics can be obtained.

According to an embodiment, the third cladding layer has an extended portion covering the surface of the current constrictive layer, the extended portion having a thickness set thinner than that of the portion of the third cladding layer filled in the through-channel.

According to the above arrangement, the third cladding layer has the extended portion covering the surface of the current constrictive layer, and the extended portion has a thickness set thinner than that of the portion filled in the through-channel. In this case, when the layers which make a double heterostructure are formed using, for example, the MOCVD process, the active layer becomes slightly bent adjacent edge of the through-channel. As a result, a waveguide arrangement is obtained which has both a characteristic of an effective refractive index guide structure utilizing the light absorption of the substrate (current constrictive layer) and a characteristic of a real refractive index guide structure utilizing a bend of the active layer, that is, the advantages of both of the prior art arrangements described. In other words, the semiconductor laser device can reduce mode loss relative to the fundamental mode and increase mode loss relative to the higher-order mode, so that the fundamental mode is further stabilized.

A semiconductor light-emitting device of an embodiment comprises extension to the current constrictive layer having the other type of conductivity and filled in a peripheral portion of the through-channel, the extension having a surface flush with the surface of the current constrictive layer; and the third cladding layer being disposed inward of the extension to the current constrictive layer within the through-channel.

With the above arrangement, the extension to the current constrictive layer which has the other type of conductivity is filled in the peripheral portion of the through-channel, and the surface of the extension is flush with the surface of the current constrictive layer. Further, the third cladding layer is filled inward of the extension to the current constrictive layer within the through-channel. Therefore, in operation a width of current injection is proportionally reduced by the extension to the current constrictive layer. Therefore, an oscillation threshold value thereof is further reduced and, in addition, some astigmatism reduction is achieved.

According to an embodiment, a plurality of the through-channels are formed in the current constrictive layer, the third cladding layer being embedded in each of the through-channels.

With the above arrangement, the plurality of through-channels are formed in the current constrictive layer, with the third cladding layer being embedded in each of the through-channels. Thus, in operation a plurality of oscillation regions develop according to the number of current paths formed by the through-channels. This provides a semiconductor laser array.

A semiconductor light-emitting device of an embodiment comprises at least one non-through channel formed in parallel with the through-channel in the current constrictive layer to a depth not greater than the depth of the current constrictive layer; and a fourth cladding layer having the one type of conductivity and filled in the non-through channel, the fourth cladding layer having a surface flush with the surface of the current constrictive layer.

According to the arrangement, the at least one non-through channel is formed in parallel with the through-channel in the current constrictive layer to a depth not greater than the depth of the current constrictive layer, and further a fourth cladding layer having the one type of conductivity is filled in the non-through channel, the surface of the fourth cladding layer being flush with the surface of the current constrictive layer. In this case, any strain that is applied to the active layer because of the respective layers stacked on the substrate is dispersed over the non-through channel. Thus, the strain exerted on the oscillation region over the through-channel is alleviated so that a long-term reliability of the device can be enhanced.

Also, there is provided a semiconductor light-emitting device including a substrate having one of p- and n-conductivity types, a current constrictive layer formed on a surface of the substrate and having the other of the p- and n-conductivity types, the current constrictive layer having a through-channel extending to the surface of the substrate for defining a current path in a direction perpendicular to the surface of the substrate, and a double heterostructure formed on the current constrictive layer and including a first cladding layer, an active layer and a second cladding layer, characterized in that:

the through-channel is of a circular pattern; and the semiconductor light-emitting device comprises a third cladding layer having the one type of conductivity and filled in the through-channel, the third cladding layer having a surface flush with the surface of the current constrictive layer.

The semiconductor light-emitting device includes the substrate having one of the p- and n-conductivity types, and the current constrictive layer formed on the surface of the substrate and having the other of the p- and n-conductivity types, the current constrictive layer having the through-channel of a circular pattern formed therein. Accordingly, this semiconductor light-emitting device can constitute a surface output type light-emitting diode. The light-emitting diode comprises the third cladding layer having the one type of conductivity and filled in the through-channel, the third cladding layer having a surface flush with the surface of the current constrictive layer. Therefore, the first cladding layer, active layer and second cladding layer which constitute the double heterostructure are formed by a known growth method, for example, MOCVD process, flatly over the current constrictive and third cladding layers in a well-controlled manner, without involving any stage of etching. Therefore, the first cladding layer, active layer and second cladding layer involve almost no variation in thickness. This insures good stability in radiation intensity-applied current characteristics. The fact that no etching stage is involved after the formation of the third cladding layer eliminates the possibility of any growth interface being oxidized. This results in decreased current leakage and increased light emission intensity. In this way, the light-emitting diode having improved performance characteristics can be obtained.

Where the layer forming the double heterostructure is configured to be frusto-conical, the efficiency of light output of the device can be enhanced.

According to an embodiment, the substrate is a GaAs substrate, the surface of the substrate being (111)B face or a face offset to the (111)B face which is a main face;

the current constrictive layer is comprised of GaAs or AlGaAs; and the third cladding layer is comprised of AlGaAs.

According to the arrangement, the substrate is the GaAs substrate having the (111)B face or the face offset to the (111)B face which is a main face; the current constrictive layer is comprised of GaAs or AlGaAs; and the third cladding layer is comprised of AlGaAs. In this case, as will be described hereinafter, it is possible to grow the third cladding layer comprised of AlGaAs having the one type of conductivity within the through-channel while the substrate is kept at a temperature of not more than 720° C. in such a manner that the surface of the third cladding layer becomes flush with the surface of the current constrictive layer thereby to fill the through-channel. Therefore, the first cladding layer, active layer, and second cladding layer which constitute a double heterostructure can be grown by the known growth technique flatly over the substrate in a well controlled manner.

There is provided a method of making a semiconductor light-emitting device comprising the steps of:

forming on a surface of a GaAs substrate having one of p- and n-conductivity types a current constrictive layer comprised of GaAs or AlGaAs and having the other of the p- and n-conductivity types, the surface being (111)B face or a face offset to the (111)B face which is a main face;

forming in the current constrictive layer a through-channel of a predetermined pattern which extends from a surface of the current constrictive layer to the substrate;

growing a third cladding layer comprised of AlGaAs and having the one type of conductivity within the through-channel while the substrate is kept at a temperature of not more than 720° C. to fill the through-channel with the third cladding layer in such a manner that the surface of the third cladding layer becomes flush with the surface of the current constrictive layer; and successively growing a first cladding layer, an active layer, and a second cladding layer over the substrate to form a double heterostructure.

According to the method of making a semiconductor light-emitting device, on the surface of the GaAs substrate having the one of the p- and n-conductivity types is formed the current constrictive layer comprised of GaAs or AlGaAs and having the other of the p- and n-conductivity types, the substrate surface having (111)B face or a face offset to the (111)B face which is a main face. The through-channel of the predetermined pattern which extends from the surface of the current constrictive layer to the substrate is then formed in the current constrictive layer. Then, the third cladding layer comprised of AlGaAs and having the one type of conductivity is grown within the through-channel while the substrate is kept at the temperature of not more than 720° C. This enables the third cladding layer to be grown so that its surface becomes flush with the surface of the current constrictive layer thereby to fill the through-channel. Therefore, the first cladding layer, active layer, and second cladding layer can be formed flatly over the third cladding layer and current constrictive layer in a well controlled manner to form a double heterostructure. Thus, it is now possible to fabricate semiconductor light-emitting devices, such as a semiconductor laser device and a light-emitting diode, which have good characteristic improvement over the prior art devices.

Also, there is provided a method of making a semiconductor light-emitting device comprising the steps of:

forming on a surface of a GaAs substrate having one of p- and n-conductivity types a current constrictive layer comprised of GaAs or AlGaAs and having the other of the p- and n-conductivity types, the surface being (111)B face or a face offset to the (111)B face which is a main face;

forming in the current constrictive layer a through-channel of a predetermined pattern which extends from a surface of the current constrictive layer to the substrate;

growing a third cladding layer comprised of AlGaAs and having the one type of conductivity while the substrate is kept within a temperature range of 720° C. to 740° C. in such a manner that one portion of the third cladding layer which fills the through-channel has a surface flush with the surface of the current constrictive layer and that the third cladding layer has an extended portion overlying the surface of the current constrictive layer and being thinner than the fill portion; and successively growing a first cladding layer, an active layer, and a second cladding layer over the substrate to form a double heterostructure.

According to the method of making a semiconductor light-emitting device, after the through-channel is formed in the current constrictive layer, the third cladding layer comprised of AlGaAs and having the one type of conductivity is grown while the substrate is kept within the temperature range of 720° C. to 740° C. so as to fill the through-channel in such a manner that the surface of that portion of the third cladding layer which fills the through-channel is flush with the surface of the current constrictive layer and that the third cladding layer has an extended portion overlying the surface of the current constrictive layer which is thinner than the fill portion. Therefore, when the layers constituting the double heterostructure are formed on the current constrictive layer using, for example, the MOCVD technique, the active layer is configured to be slightly bent adjacent the edge of the through-channel. As a result, the semiconductor light-emitting device made has a waveguide arrangement featuring both the characteristic of an effective refractive index guide structure utilizing the light absorption of the substrate (current constrictive layer) and the characteristic of a real refractive index guide structure utilizing the bend of the active layer, that is, the advantages of both of the prior art arrangements shown. In other words, the semiconductor laser device can reduce mode loss relative to the fundamental mode and increase mode loss relative to the higher-order mode, so that the fundamental mode is further stabilized. Furthermore, possible current leaks are reduced and the oscillation threshold limit is lowered.

Also, there is provided a method of making a semiconductor light-emitting device comprising the steps of:

forming on a surface of a GaAs substrate having one of p- and n-conductivity types a current constrictive layer comprised of GaAs or AlGaAs and having the other of the p- and n-conductivity types, the surface being (111)B face or a face offset to the (111)B face which is a main face;

forming in the current constrictive layer a through-channel of a predetermined pattern which extends from a surface of the current constrictive layer to the substrate;

growing in a peripheral portion of the through-channel an extension to the current constrictive layer which is comprised of GaAs or AlGaAs and has the other type of conductivity while the substrate is kept at a temperature of not more than 720° C., in such a manner that a surface of the extension is flush with the surface of the current constrictive layer thereby to reduce a width of the through-channel;

growing a third cladding layer comprised of AlGaAs and having the one type of conductivity within the through-channel and internally of the extension to the current constrictive layer while the substrate is kept at a temperature of not more than 720° C., to fill the third cladding layer inside the extension in such a manner that a surface of the third cladding layer is flush with the surface of the current constrictive layer; and successively growing a first cladding layer, an active layer, and a second cladding layer over the substrate to form a double heterostructure.

According to the method of making a semiconductor light-emitting device, the extension to the current constrictive layer which has the other type of conductivity and whose surface is flush with the surface of the current constrictive layer is filled in the peripheral portion of the through-channel in the current constrictive layer, and the third cladding layer is embedded internally of the extension to the current constrictive layer. Therefore, when the semiconductor light-emitting device thus made is in operation, the width of current injection is proportionally reduced by the extension to the current constrictive layer. With such semiconductor light-emitting device, and semiconductor laser device in particular, therefore, the oscillation threshold value is further reduced and, in addition, some astigmatism reduction is achieved.

Furthermore, there is provided a method of making a semiconductor light-emitting device comprising the steps of:

forming on a surface of a GaAs substrate having one of p- and n-conductivity types a current constrictive layer comprised of GaAs or AlGaAs and having the other of the p- and n-conductivity types, the surface being (111)B face or a face offset to the (111)B face which is a main face;

forming in the current constrictive layer a plurality of through-channels of a predetermined pattern which extend from a surface of the current constrictive layer to the substrate;

growing third cladding layers comprised of AlGaAs and having the one type of conductivity within the respective through-channels while the substrate is kept at a temperature of not more than 720° C., in such a manner that a surface of each of the third cladding layers is flush with the surface of the current constrictive layer, thereby filling the through-channels; and successively growing a first cladding layer, an active layer, and a second cladding layer over the substrate to form a double heterostructure.

According to the method of making a semiconductor light-emitting device, the through-channels are formed in plurality in the current constrictive layer, and the third cladding layers are filled in respective through-channels. With such a semiconductor light-emitting device, in operation a plurality of oscillation regions develop according to the number of current paths formed by the through-channels. This provides a semiconductor laser array.

Furthermore, there is provided a method of making a semiconductor light-emitting device comprising the steps of:

forming on a surface of a GaAs substrate having one of p- and n-conductivity types a current constrictive layer comprised of GaAs or AlGaAs and having the other of the p- and n-conductivity types, the surface being (111)B face or a face offset to the (111)B face which is a main face;

forming in the current constrictive layer a non-through channel of a predetermined pattern which is held within the current constrictive layer;

forming in the current constrictive layer a through-channel of a predetermined pattern which extends from a surface of the current constrictive layer to the substrate;

growing third and fourth cladding layers comprised of AlGaAs and having the one type of conductivity respectively within the through-channel and non-through channel while the substrate is kept at a temperature of not more than 720° C., to respectively fill the through-channel and non-through channel with the third and fourth cladding layers in such a manner that the surfaces of the third and fourth cladding layers are respectively flush with the surface of the current constrictive layer; and successively growing a first cladding layer, an active layer, and a second cladding layer over the substrate to form a double heterostructure.

According to the method of making a semiconductor light-emitting device, the non-through channel having a depth of not more than the depth of the current constrictive layer is provided in parallel with the through-hole in the current constrictive layer, and the fourth cladding layer having the one type of conductivity is embedded in the non-through channel, with the surface of the fourth cladding layer being made flush with the surface of the current constrictive layer. By virtue of this arrangement, any strain exerted on the oscillation region over the through-channel is alleviated so that good improvement can be obtained in a long-term reliability of the device.

Moreover, there is provided a method of making a semiconductor light-emitting device comprising the steps of:

forming on a surface of a GaAs substrate having one of p- and n-conductivity types a current constrictive layer comprised of GaAs or AlGaAs and having the other of the p- and n-conductivity types, the surface having (111)B face or a face offset to the (111)B face which is a main face;

forming in the current constrictive layer a through-channel of a circular pattern which extends from a surface of the current constrictive layer to the substrate;

growing a third cladding layer comprised of AlGaAs and having the one type of conductivity within the through-channel while the substrate is kept at a temperature of not more than 720° C., to fill the through-channel with the third cladding layer in such a manner that a surface of the third cladding layer is flush with the surface of the current constrictive layer;

successively growing a first cladding layer, an active layer, and a second cladding layer over the substrate to form a double heterostructure; and working the layer forming the double heterostructure to a frusto-conical configuration.

According to the method of making a semiconductor light-emitting device, after the through-channel of a circular pattern which extends from the surface of the current constrictive layer to the substrate is formed in the current constrictive layer, the third cladding layer having the one type of conductivity is grown within the through-channel while the substrate is kept at a temperature of not more than 720° C., in such a manner that the surface of the third cladding layer is flush with the surface of the current constrictive layer, thereby filling the through-channel. Further, the first cladding layer, active layer, and second cladding layer are grown over the current constrictive layer and third cladding layer to form the double heterostructure. Thus, a surface output type light-emitting diode is constructed. In this case, the layers which constitute the double heterostructure are flatly formed by a known growth method, for example, MOCVD process, in a well-controlled manner, without involving any stage of etching. Therefore, almost no variation is involved in thickness. This insures good stability in radiation intensity-applied current characteristics. Furthermore, since no etching process is involved after the formation of the third cladding layer, there is no possibility of any growth interface being oxidized. This results in decreased current leakage and increased light emission intensity. In this way, a light-emitting diode having improved performance characteristics can be obtained. Moreover, because of the fact that the layers forming the double heterostructure are configured to be frusto-conical, the efficiency of light output of the device can be enhanced.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Preferred embodiments of the invention will now be described in detail with reference to the accompanying drawings. It should be noted that hatchings for some parts are omitted for the sake of simplicity in FIGS. 1–3, 5A–5E, 6–9, 10A, 11 and 12.

(First Embodiment)

Figure 1:
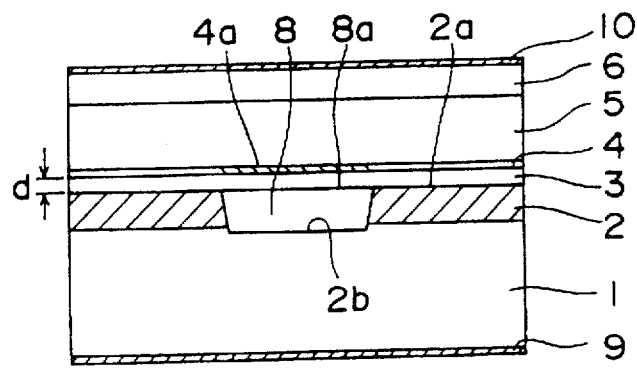
FIG. 1 is a sectional view showing a semiconductor laser device representing a first embodiment of the present invention.

FIG. 1 shows a section of a semiconductor laser device representing a first embodiment of the present invention. The semiconductor laser device includes a p-GaAs substrate 1 and, on (111)B face of the substrate 1, an n-GaAs current constrictive layer (1 µm thick) 2, a p-$(Al_{0.5}Ga_{0.5})_{0.5}In_{0.5}P$ first cladding layer (0.2 µm thick) 3, a non-doped $Ga_{0.5}In_{0.5}P$ active layer (0.05 µm thick) 4, an n-$(Al_{0.5}Ga_{0.5})_{0.5}In_{0.5}P$ second cladding layer (1.5 µm thick) 5, and an n-$Ga_{0.5}In_{0.5}P$ contact layer (0.5 µm thick) 6. Shown by 4a is an oscillation region (indicated by oblique lines), and shown by 9 and 10 are electrodes. A belt-like through-channel 2b extending perpendicularly to the section is formed centrally in the current constrictive layer 2, and a p-$Al_{0.7}Ga_{0.3}As$ third cladding layer (1.3 µm thick) 8 is embedded in the through-channel 2b. The surface 8a of the third cladding layer 8 is flush with the surface 2a of the current constrictive layer 2.

Figure 4:
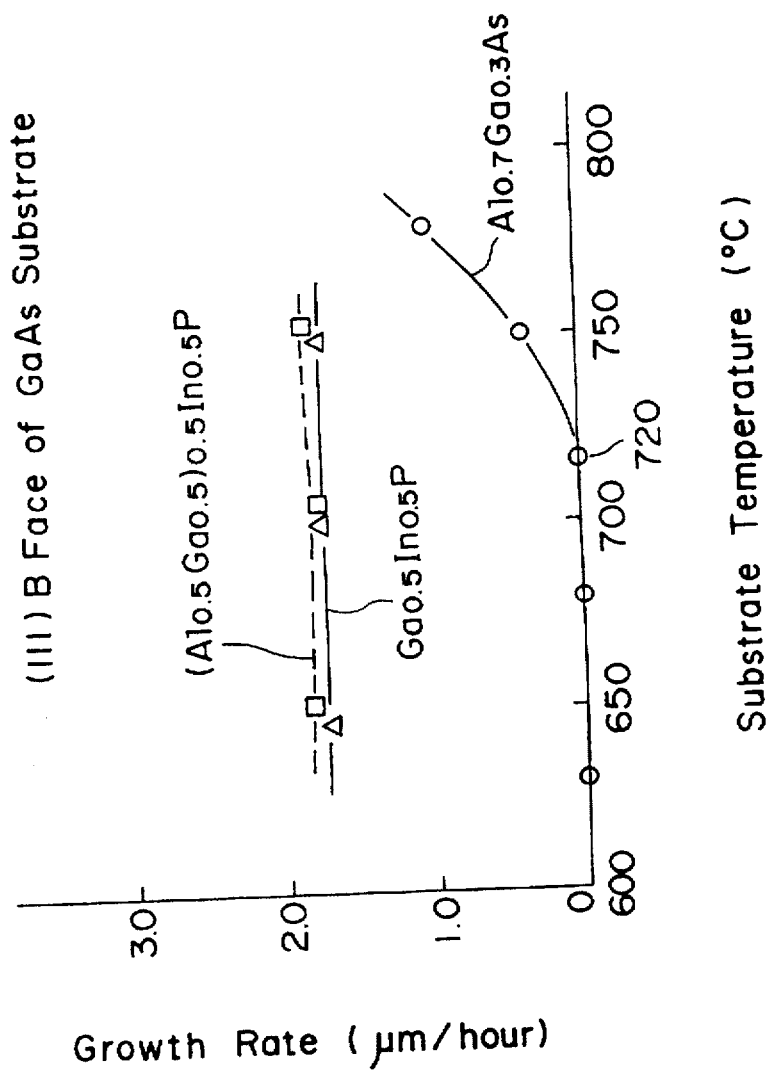
FIG. 4 is a diagram showing the relations between growth rates of AlGaAs, GaInP, and AlGaInP layers on (111) B surface of a GaAs substrate and substrate temperatures.

Before the steps of fabricating the device are discussed, basic phenomenal factors will be explained. The present inventors have found that when an $Al_{0.7}Ga_{0.3}As$ layer, a $Ga_{0.5}In_{0.5}P$ layer, an $(Al_{0.5}Ga_{0.5})_{0.5}In_{0.5}P$ layer are grown by the MOCVD process on a GaAs substrate (of either n or p conductivity type) having (111)B face as a main face, the relationship between growth rate of each layer and substrate temperature is as shown in FIG. 4. Materials used for layer growth were TMG (trimethyl gallium), TMA (trimethyl aluminum), TMI (trimethyl indium), $AsH_3$ (arsine), and $PH_3$ (phosphine). In this experiment, for AlGaAs growth, V group element to III group element supply ratio (hereinafter called "V/III ratio") was set at 80, and III group element supply quantity (the sum of TMG and TMA supply quantities) was set at $1.6\times10^{-5}$ mol/min. For GaInP and AlGaInP growth, V/III ratio was set at 200, and III group element supply quantity (the sum of TMG, TMA and TMI supply quantities) was set at $2.0\times10^{-5}$ mol/min. Similar experiments were carried out with cases of $Al_xGa_{1-x}As$ and $(Al_xGa_{1-x})_yIn_{1-y}P$ in which Al proportions x were varied (x=0–1). Where III group element supply quantity was same, almost same results as shown in FIG. 4 were obtained. As is apparent from FIG. 4, when the substrate temperature is lower than 720° C., there is no growth of AlGaAs layer on (111)B face of a GaAs substrate. GaInP and AlGaInP layers can grow over a wide temperature range (650° to 750° C.), and their growth rates are almost constant, being not dependent on the substrate temperature. The process for manufacturing the device of the invention utilizes this phenomenon.

The relationship between growth rate on (111)B face of a GaAs substrate and substrate temperature has been known with respect to GaAs growth (Journal of Crystal Growth, Vol. 94 (1989) p.p. 203–207 (hereinafter called "Reference 1"). FIG. 1 of the Reference 1 shows that the growth rate of GaAs, as is the case with the growth rate shown for $Al_xGa_{1-x}As$ in FIG. 4 of the present application, is zero when the substrate temperature is lower than 720° C. and crystal growth begins at a substrate temperature of more than 720° C. However, the description given in the Reference 1 concerns only the characteristics of GaAs growth on (111)B face of GaAs substrate, and does not relate to the growth of AlGaAs, GaInP, and AlGaInP on (111)B face of GaAs substrate. As will be described in detail hereinafter, the advantageous effect of the present invention can only be achieved through the use of AlGaAs and not GaAs as material for third cladding layer 8 shown in FIG. 1. In other words, the present invention cannot be derived from Reference 1, and the invention has been developed only through the discovery of the phenomenal fact on the growth of AlGaAs, GaInP, and AlGaInP as shown in FIG. 4.

Figure 5A:
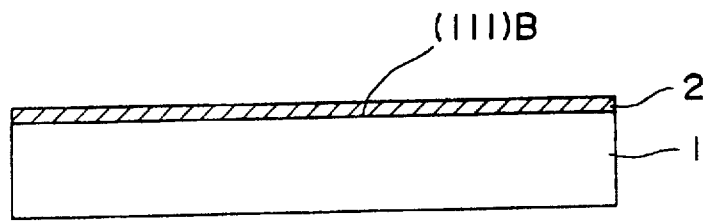
FIGS. 5A, 5B, 5C, 5D and 5E are diagrammatic views explanatory of the process for manufacturing the semiconductor laser device of the first embodiment.
Figure 5B:
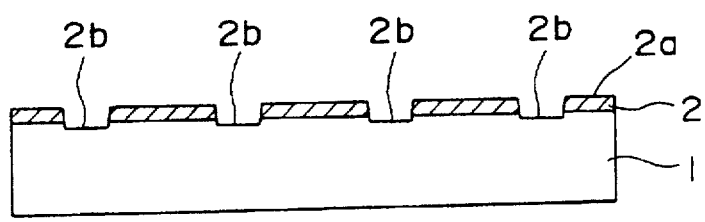

For the purpose of making the semiconductor laser device, as FIG. 5A shows, an n-GaAs current constrictive layer 2 is grown 1 μm thick on (111)B face of p-GaAs substrate 1 by using liquid phase growing technique. Then, as FIG. 5B shows, etching is carried out to form through-channels 2b, 2b, . . . of 4 μm wide and 1.3 μm deep which extend from the surface 2a of the current constrictive layer 2 to the p-GaAs substrate. In the present example, the orientation of each through-channel 2b was

[$\bar{1}$00] direction.

Figure 5C:
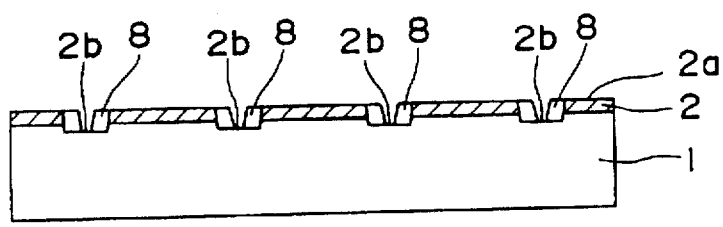
Figure 5D:
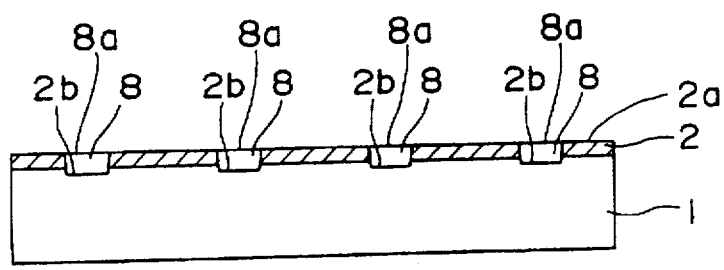
Figure 5E:
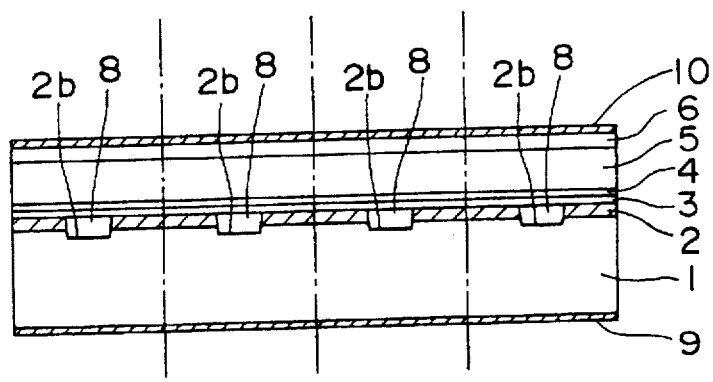

Then, as FIGS. 5C and 5D show, a p-$Al_{0.7}Ga_{0.3}As$ cladding layer 8 was grown over the substrate 1 by the MOCVD process. Growing conditions were: substrate temperature, 700° C.; and V/III ratio, 80. As earlier explained with reference to FIG. 4, under these growth conditions the rate of growth on (111)B face of GaAs substrate 1 is almost zero. Therefore, AlGaAs layer does not grow at the bottom of through-channel 2b nor does it grow on the surface of the n-GaAs current constrictive layer 2. Instead, as FIG. 5C shows, the AlGaAs layers 8 grow inwardly from the side walls of through-channel 2b and, as FIG. 5D shows, the through-channel is entirely filled when fronts of the AlGaAs layers growing from the upper edges of the side wall meet together. As a result, the surface 8a of each cladding layer 8 becomes flush with the surface 2a of the current constrictive layer 2, so that the surface side of the substrate 1 becomes flat. Subsequently, as FIG. 5E shows, a p-AlGaInP cladding layer 3, a non-doped GaInP active layer 4, an n-AlGaInP cladding layer 5, and an n-GaInP contact layer 6 were grown on the surface side of the substrate by the MOCVD process. Growth conditions were: substrate temperature, 700° C.; and V/III ratio, 200. In this case, the AlGaInP layers 3, 5 and GaInp layers 4, 6 exhibit a growth pattern different from that seen with the AlGaAs layer, that is, growth occurs on the (111)B face as well (growth rate is 1.7 μm/hour under the aforesaid growth conditions). Then, electrodes 9, 10 were formed respectively on the underside of the substrate 1 and on the surface of the contact layer 6. Finally, the product was split along each chain line in FIG. 5E into chips to give the same semiconductor laser device as shown in FIG. 1.

According to the above described method, p-AlGaInP cladding layer 3 is grown by the MOCVD process in a well controlled manner and is not subjected to etching. Therefore, little or no variation occurs with respect to the thickness d of cladding layer 3. This leads to good stability in the fundamental mode. The fact that no etching step is involved eliminates the possibility of oxidation with any growth interface. Current leakage is decreased, and oscillation threshold limit is lowered. The cladding layer 3 on the current constrictive layer 2 is so thin that higher-order mode loss can be moderately maintained. This results in good improvement in the kink level. True, semiconductor laser devices thus fabricated, in noncoat condition and with resonator length of 400 μm, had an oscillation threshold limit of 40 mA and oscillated up to 50 mW without kink. Its oscillation wavelength was 679 nm during 50 mW output. As compared with the prior art semiconductor laser device shown in FIG. 11 which, in the condition of noncoat and resonator length 400 μm, had an oscillation threshold value of 45 mA and a kink level of 25 mW, this is considerable improvement or two-fold improvement in kink level.

For purposes of comparison, a device having a sectional construction identical with the device shown in FIG. 1 was made using GaAs as material for a third cladding layer and utilizing the phenomenon shown in FIG. 1 of the Reference 1. However, laser oscillation was not achieved with this device for comparison. The reason was that since the third cladding layer was made of GaAs, it was not possible to obtain any gain necessary for laser oscillation. This tells that the material for the third cladding layer 8 must be AlGaAs as explained above.

(Second Embodiment)

Figure 2:
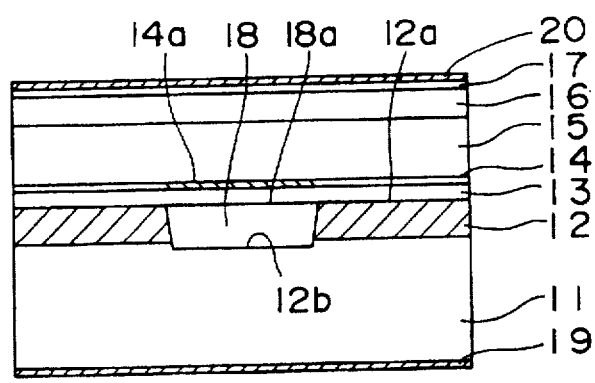
FIG. 2 is a sectional view of a semiconductor laser device representing a second embodiment of the invention.

FIG. 2 shows a section of a semiconductor laser device representing a second embodiment of the invention. This semiconductor laser device includes a p-GaAs substrate 11 and, on (111)B face of the substrate offset by 2° to a direction of

[$\bar{1}$00], an n-GaAs current constrictive layer (1 μm thick) 12, a p-$(Al_{0.7}Ga_{0.3})_{0.5}In_{0.5}P$ first cladding layer (0.2 μm thick) 13, a non-doped $(Al_{0.1}Ga_{0.9})_{0.5}In_{0.5}P$ active layer (0.05 μm thick) 14, an n-$(Al_{0.7}Ga_{0.3})_{0.5}In_{0.5}P$ second cladding layer (1.5 μm thick) 15, an n-$Ga_{0.5}In_{0.5}P$ contact layer (0.5 μm thick) 16, and an n-GaAs contact layer (0.1 μm thick) 17. Shown by 14a is an oscillation region, and shown by 19 and 20 are electrodes. A belt-like through-channel 12b extending perpendicularly to the section is formed centrally in the current constrictive layer 12, and a p-$Al_{0.7}Ga_{0.3}As$ third cladding layer (1.3 μm) 18 is embedded in the through-channel 12b. The surface 18a of the cladding layer 18 is flush with the surface 12a of the current constrictive layer 12.

This semiconductor laser device is different from the one of the first embodiment in that the layers 12, 13 . . . are formed on (111)B face inclined by 2° to the direction of

[$\bar{1}$00]

and in that the n-Ca contact layer 17 is provided over the n-GaInP contact layer 16. The provision of the n-GaAs contact layer 17 facilitates ohmic contact with the electrode 20, whereby the resistance of the device can be reduced. Further, a double heterostructure consists of the p-$(Al_{0.7}Ga_{0.3})_{0.5}In_{0.5}P$ cladding layer 13, the non-doped $(Al_{0.1}Ga_{0.9})_{0.5}In_{0.5}P$ active layer 14, the n-$(Al_{0.7}Ga_{0.3})$ $_{0.5}$In$_{0.5}$P cladding layer 15. This arrangement provides an oscillation wavelength of 650 nm.

In fabricating the device, as is the case with the first embodiment, the substrate temperature was set at 700° C., at which temperature were formed layers of from cladding layer 18 to contact layer 17. Despite the fact that layers were formed at an orientation offset by 2° from (111)B face of the p-GaAs substrate 11, the surface 18a of the cladding layer 18 could be made flush with the surface 12a of the current constrictive layer 12. The contact layer 17 was grown on the surface of the contact layer 16 ((111)B face of GaAs) in such a condition that the substrate temperature was raised to 740° C. so as to enable GaAs to grow on (111)B face as well.

This semiconductor laser device, as was the case with the device of the first embodiment, exhibited good fundamental mode stability. Current leakage was decreased; oscillation threshold limit was lowered; and kink level was enhanced. A coating of Al$_2$O$_3$, of $\lambda/2$ thickness ($\lambda$ represents oscillation wavelength) was applied to each end face of a chip of resonator length of 500 μm. At this condition, the device exhibited satisfactory characteristics: oscillation threshold value, 50 mA; and kink level, 45 mW.

(Third Embodiment)

Figure 3:
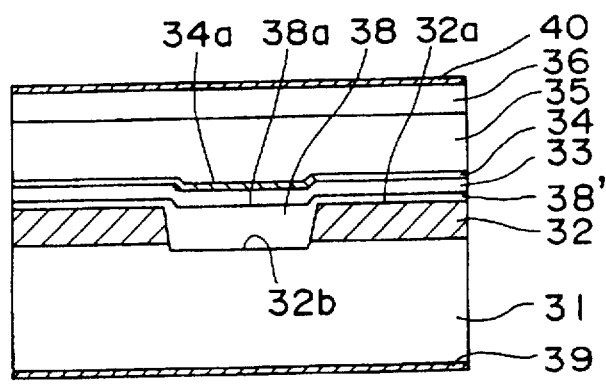
FIG. 3 is a sectional view of a semiconductor laser device representing a third embodiment of the invention.

FIG. 3 shows a section of a semiconductor laser device representing a third embodiment of the invention. The semiconductor laser device includes a p-GaAs substrate 31 and, on (111)B face of the p-GaAs substrate 31, an n-GaAs current constrictive layer (1 μm thick) 32, a p-Al$_{0.7}$Ga$_{0.3}$As third cladding layer (0.02 μm thick) 38', a p-(Al$_{0.5}$Ga$_{0.5}$)$_{0.5}$In$_{0.5}$P first cladding layer (0.2 μm thick) 33, a non-doped Ga$_{0.38}$In$_{0.62}$P active layer (0.02 μm thick) 34, an n-(Al$_{0.5}$Ga$_{0.5}$)$_{0.5}$In$_{0.5}$P second cladding layer (1.5 μm thick) 35, and an n-Ga$_{0.5}$In$_{0.5}$P contact layer (0.5 μm thick) 36. Shown by 34a is an oscillation region, and shown by 39 and 40 are electrodes. A belt-like through-channel 32b extending perpendicularly to the section is formed centrally in the current constrictive layer 32, and a p-Al$_{0.7}$Ga$_{0.3}$As third cladding layer (1.3 μm thick) 38 is embedded in the through-channel 32b. The cladding layer 38' is an extended portion which is connected integrally with the cladding layer 38, and coves the surface of the current constrictive layer 32. The surface 38a of the cladding layer 38 is flush with the surface 32a of the current constrictive layer 32.

This semiconductor laser device is different from the device of the first embodiment in that the composition of the active layer 34 is non-doped Ga$_{0.38}$In$_{0.62}$P to give some distorted effect, and in that the substrate temperature was set at 730° C. during the growth of cladding layer 38 thereby to allow slight growth of AlGaAs layer 38' on the surface (GaAs (111)B face) 32a of the current constrictive layer 32 on both sides of the through-channel 32b. In consequence, the active layer 34 is slightly bent over the edges of the through-channel 32b as shown. Thus, the device has a waveguide structure having the characteristic of an effective refractive index guide utilizing the light absorption of the substrate (current constrictive layer) and the characteristic of a real refractive index guide structure utilizing bending of the active layer, that is, the advantages of both of the two prior art arrangements show in FIGS. 11 and 12. In other words, the semiconductor laser device can reduce mode loss with respect to fundamental mode and enhance mode loss with respect to higher-order mode, thereby further stabilizing the fundamental mode. Further, as the device of the first embodiment does, this device provides for current leakage reduction, oscillation threshold value decrease, and kink level improvement.

Under the conditions of resonator length 600 μm, and reflection factors, front side 8% and rear side 70%, the device exhibited an oscillation threshold value of 55 mA and a kink level of 220 mW (oscillation wavelength 690 nm). This indicates some twofold improvement as compared with the kink level (about 120 mW) of the prior art device shown in FIG. 11 in which same double heterostructure as the present embodiment is employed.

To fabricate the device, a through-channel 32b is formed in the current constrictive layer 32 in the same way as in the first embodiment, and then the substrate temperature is set at 730° C. at which temperature are formed layers including cladding layer 38 through contact layer 36. With the substrate temperature so set at 730° C., the cladding layer 38 was grown within the through-channel 32b in such a manner that its surface was flush with the surface of the current constrictive layer 32, so as to fill in the through-groove 32b. Also, an extension 38' to the cladding layer 38 which was thinner than that portion of the cladding layer 38 which filled the through-channel 32b was grown on the surface of the current constrictive layer 32. Further, layers 33, 34, 35 . . . were grown over the cladding layer 38 inclusive of the extension 38' at a moderate rate of growth. Aforesaid waveguide structure was thus formed. In this case, a temperature range of 720° to 740° C. is suitable for the substrate temperature. If the temperature is less than 720° C., it is not possible to grow the extension 38'. If the temperature is more than 740° C., the extension 38' grows excessively thick.

(Fourth Embodiment)

Figure 6:
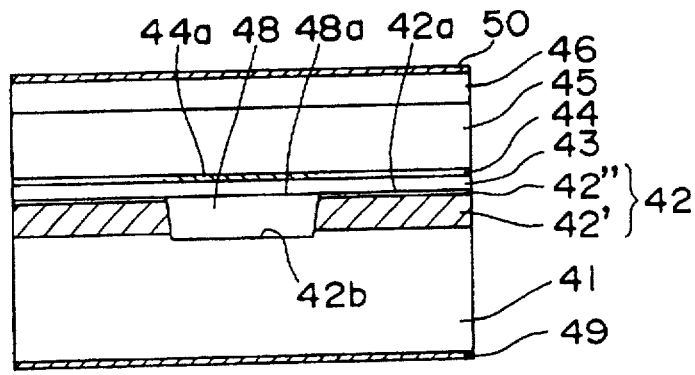
FIG. 6 is a sectional view showing a semiconductor laser device representing a fourth embodiment of the invention.

FIG. 6 shows a section of a semiconductor laser device representing a fourth embodiment of the invention. This semiconductor laser device includes a p-GaAs substrate 41 and, on (111)B face of the p-GaAs substrate 41, a current constrictive layer 42 (1 μm thick) consisting of two layers 42', 42", a p-(Al$_{0.5}$Ga$_{0.5}$)$_{0.5}$In$_{0.5}$P first cladding layer (0.2 μm thick) 43, a non-doped Ga$_{0.5}$In$_{0.5}$P active layer (0.05 μm thick) 44, an n-(Al$_{0.5}$Ga$_{0.5}$)$_{0.5}$In$_{0.5}$P second cladding layer (1.5 μm thick) 45, and an n-Ga$_{0.5}$In$_{0.5}$P contact layer (0.5 μm thick). Shown by 44a is an oscillation region, and shown by 49, 50 are electrodes. A through-channel 42b extending perpendicularly to the section is formed centrally in the current constrictive layer 42, and a p-Al$_{0.7}$Ga$_{0.3}$As third cladding layer (1.3 μm thick) is filled in this through-channel 42b. The surface 48a of the cladding layer 48 is flush with the surface 42a of the current constrictive layer 42.

This semiconductor laser device is different from the device of the first embodiment in that the current constrictive layer 42 is of a two-layer construction consisting of n-Al$_{0.1}$Ga$_{0.9}$As (0.9 μm thick) 42' and n-GaAs (0.1 μm thick) 42". To fabricate this semiconductor laser device, after n-Al$_{0.1}$Ga$_{0.9}$As (0.9 μm thick) 42' and n-GaAs (0.1 μm thick) 42" are formed, a through-channel 42b is formed centrally in the current constrictive layer 42 which extends from the surface of the layer 42" to the substrate 41. Then, the AlGaAs layer 48 is grown on the substrate 41 by MOCVD process. In the same way as in the first embodiment, selective growth occurred at a substrate temperature of less than 720° C. such that only the interior of the through-channel 42b was filled even when the n-Al$_{0.1}$Ga$_{0.9}$As layer 42' was exposed on the through-channel 42b side surface of the current constrictive layer 42. Such selective growth continued until the Al proportion of the AlGaAs current constrictive layer 42 reached zero or at least 0.3. Subsequently, layers 43, 44, 45 . . . were grown by MOCVD process. In this way, it is possible to form an effective refractive index guide structure utilizing light absorption of the current constrictive layer 42 and substrate 41, in a well controlled manner.

Just as the devices of the first and second embodiments did, this semiconductor laser device proved that it was effective for fundamental mode stabilization, current leak reduction, oscillation threshold value decrease, and kink level improvement.

(Fifth Embodiment)

Figure 7:
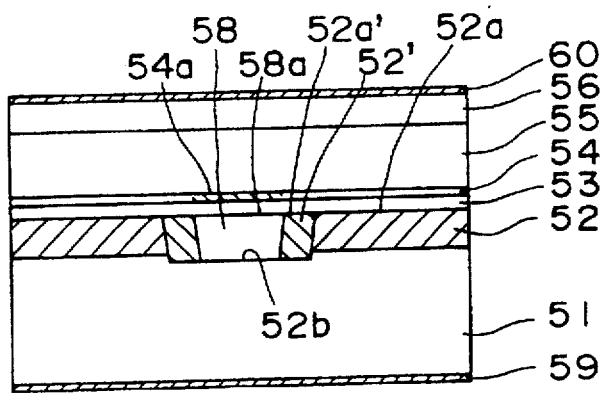
FIG. 7 is a sectional view of a semiconductor laser device representing a fifth embodiment of the invention.

FIG. 7 shows a section of a semiconductor laser device representing a fifth embodiment of the invention. This semiconductor laser device includes a p-GaAs substrate 51 and, on (111)B face of the p-GaAs substrate 51, n-GaAs current constrictive layers (1 μm thick) 52, 52', a p-$(Al_{0.5}Ga_{0.5})_{0.5}In_{0.5}P$ first cladding layer (0.2 μm thick) 53, a non-doped $Ga_{0.5}In_{0.5}P$ active layer (0.05 μm thick) 54, an n-$(Al_{0.5}Ga_{0.5})_{0.5}In_{0.5}P$ second cladding layer (1.5 μm thick) 55, and an n-$Ga_{0.5}In_{0.5}P$ contact layer (0.5 μm thick) 56. Shown by 54a is an oscillation region, and shown by 59, 60 are electrodes. A belt-like through-channel 52b is formed centrally in the current constrictive layer 52 which extends perpendicularly to the section. An n-GaAs extension 52' of the current constrictive layer is embedded in an inner peripheral portion of the through-channel 52b, and a p-$Al_{0.7}Ga_{0.3}As$ third cladding layer (1.3 μm thick) is embedded internally of the current constrictive layer extension 52'. The surface 58a of the cladding layer 58 is flush with the surfaces 52a, 52a' of the current constrictive layers 52, 52'.

In fabricating this semiconductor laser device, after a through-channel (4 μm wide) 52b is formed, an n-GaAs current constrictive layer extension 52' is laterally grown until the remaining width of the through-channel 52b is 2.5 μm, and then an AlGaAs fill layer 58 is grown. Subsequently, in the same way as in the first embodiment, layers 53, 54, 55 . . . are grown.

This semiconductor laser device, just as the device of the first embodiment does, has an effective refractive index guide structure formed in a well controlled manner, and provides for good fundamental mode stability, current leak reduction, oscillation threshold value decrease, and kink level enhancement. Furthermore, the provision of the current constrictive layer extension 52' formed in the through-channel 52b' so as to reduce the width of current injection path results in greater reduction of oscillation threshold value than in the case of the device of the first embodiment, and further in reduced astigmatism. Whereas, under conditions of non-coat, resonator length of 400 μm, the device of the first embodiment exhibited an oscillation threshold value of 40 mA and an astigmatism of 5 μm (3 mWh), the semiconductor laser device of the present embodiment exhibited an oscillation threshold value of 30 mA and an astigmatism value of 0 μm (3 mWh) under the same conditions.

(Sixth Embodiment)

Figure 8:
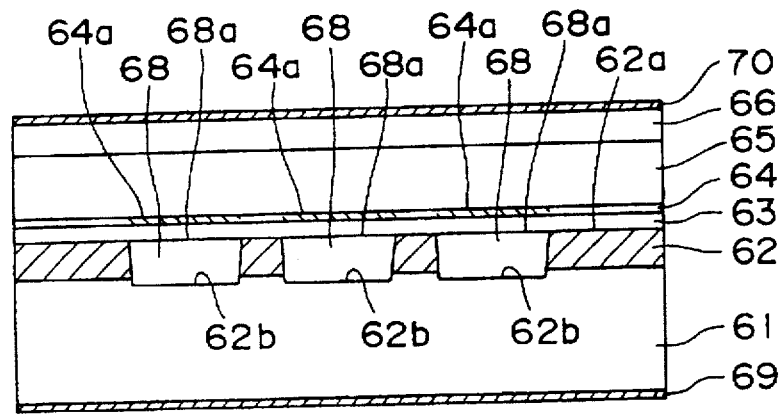
FIG. 8 is a sectional view of a semiconductor laser device representing a sixth embodiment of the invention.

FIG. 8 shows a section of a sixth embodiment of the invention. This semiconductor device includes a p-GaAs substrate 61 and, on (111)B face of the p-GaAs substrate 61, an n-GaAs current constrictive layer (1 μm thick) 62, a p-$(Al_{0.5}Ga_{0.5})_{0.5}In_{0.5}P$ first cladding layer (0.2 μm thick) 63, a non-doped $Ga_{0.5}In_{0.5}P$ active layer (0.05 μm thick) 64, an n-$(Al_{0.5}Ga_{0.5})_{0.5}In_{0.5}P$ second cladding layer (1.5 μm thick) 65, and an n-$Ga_{0.5}In_{0.5}P$ contact layer (0.5 μm thick) 66. Shown by 64a is an oscillation region, and shown by 69, 70 are electrodes. Three belt-like through-channels 62b, 62b, 62b (3.5 μm wide each, arranged at 5.5 μm pitch) which extend perpendicularly to the section are respectively formed centrally and on both sides of the current constrictive layer 62. A p-$Al_{0.7}Ga_{0.3}As$ third cladding layer (1.3 μm thick) 68 is filled in each of the through-channels 62b. The surface 68a of the cladding layer 68 is flush with the surface 62a of the current constrictive layer 62.

This semiconductor laser device is identical with the device of the first embodiment insofar as layer arrangement is concerned, but is different from the latter in that it includes a plurality of through-channels 62b formed in the current constrictive layer 62 which serve as current path, and accordingly it constitutes a semiconductor laser array having a plurality of oscillation regions 64a. With this semiconductor laser device, oscillation at 180° phase mode was observed up to such a high output as 350 mW.

To fabricate this semiconductor device, after current constrictive layer 62 is formed on the substrate 61, a plurality of through-channels 62b, 62b, 62b are formed simultaneously in the current constrictive layer 62. Thereafter, in the same way as in the first embodiment, third cladding layers 68 are filled in the respective through-channels 62b. Then, layers 63, 64, 65 . . . which make a double heterostructure are grown.

(Seventh Embodiment)

Figure 9:
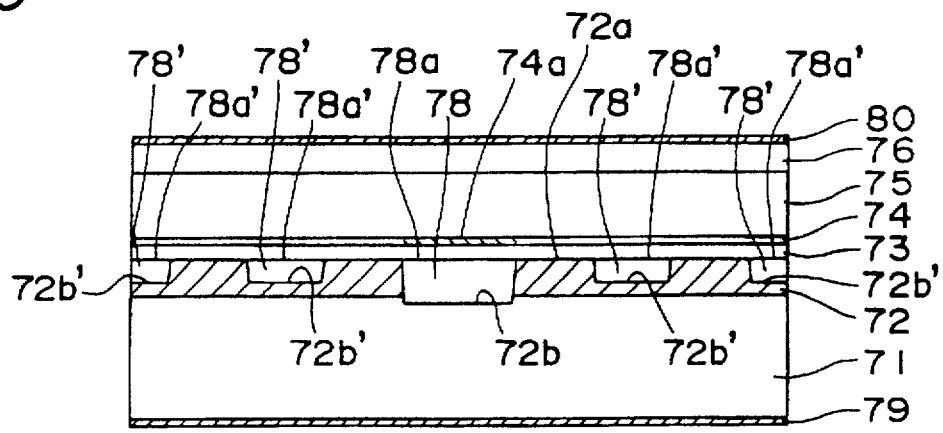
FIG. 9 is a sectional view of a semiconductor laser device representing a seventh embodiment of the invention.

FIG. 9 shows a section of a semiconductor laser device representing a seventh embodiment of the invention. This semiconductor laser device includes a p-GaAs substrate 71 and, on (111)B face of the p-GaAs substrate 71, an n-GaAs current constrictive layer (1 μm thick) 72, a p-$(Al_{0.5}Ga_{0.5})_{0.5}In_{0.5}P$ first cladding layer (0.2 μm thick) 73, a non-doped $Ga_{0.5}In_{0.5}P$ active layer (0.05 μm thick) 74, an n-$(Al_{0.5}Ga_{0.5})_{0.5}In_{0.5}P$ second cladding layer (1.5 μm thick) 75, and an n-$Ga_{0.5}In_{0.5}P$ contact layer (0.5 μm thick) 76. Shown by 74a is an oscillation region, and shown by 79 and 80 are electrodes. A belt-like through-channel 72b extending perpendicularly to the section is formed centrally in the current constrictive layer 72, and a p-$Al_{0.7}Ga_{0.3}As$ third cladding layer (1.3 μm) 78 is filled in the through-channel 72b (which serves as a current path). Belt-like non-through channels 72b' are formed in plurality at a predetermined pitch at both sides of the current constrictive layer 72. Filled in respective non-through channels 72b' are p-$Al_{0.7}Ga_{0.3}As$ fourth cladding layers. The surface of each cladding layer 78, 78' is flush with the surface 72a of the current constrictive layer 72.

To manufacture the semiconductor laser device, the current constrictive layer 72 is first formed on the substrate 71, and then non-through channels 72b', . . . which are to be retained within the current constrictive layer 72 are formed in the current constrictive layer 72. Then, a through-channel 72b which extends from the surface of the current constrictive layer 72 to the substrate 71 is formed in the current constrictive layer 72. Subsequently, in the same way as in the first embodiment, the substrate 1 is kept at a temperature of 700° C. In this condition, cladding layers 78, 78', . . . are grown simultaneously within the through-channel 72b and non-through channels 72b' in such a manner that their respective surfaces are flush with the surface of the current constrictive layer 72, to thereby fill the through-channel 72b and non-through channels 72b'. After that, in the same way as in the first embodiment, cladding layer 73, active layer 74, and cladding layer 75 are grown all over.

This semiconductor laser device is identical with the device of the first embodiment in layer construction, except that through-channel 72b and non-through channels 72b' . . . are formed in plurality in the current constrictive layer 72. The centrally located through-channel 72b extends from the surface of the current constrictive layer 72 to the substrate 71, while the non-through channels 72b' are retained within the current constrictive layer 72. Through-channel 72b is the only through-channel for defining an oscillation region, while other channels, that is, non-through channels 72b', . . . are intended to eliminate possible distortion arising from the layer structure. In the semiconductor laser device of the first embodiment which is shown in FIG. 1, all strain is applied to that portion of the active layer 74 which is located above the edges of the through-channel 2b (boundary of the oscillation region 4a). In the present embodiment, the presence of non-through channels 72b' (and AlGaAs layers filled in these channels), in addition to the through-channel 72b, provides for the dispersion of the strain exerted upon the active layer 74 into the non-through channels 72b', thus alleviating the strain of the oscillation region 74a, which fact insures good long-term reliability of the device.

(Eighth Embodiment)

Figure 10A:
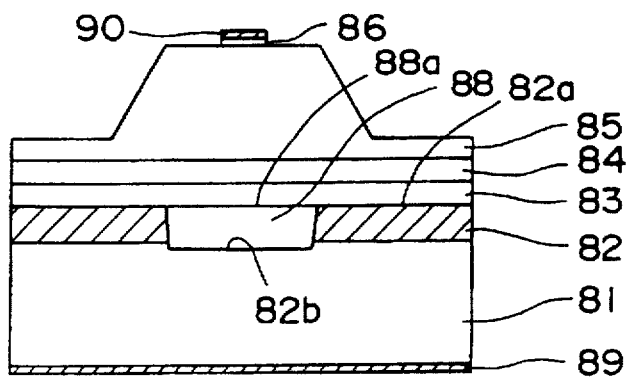
FIG. 10A is a view showing in section a light emitting diode according to an eighth embodiment of the invention.
Figure 10B:
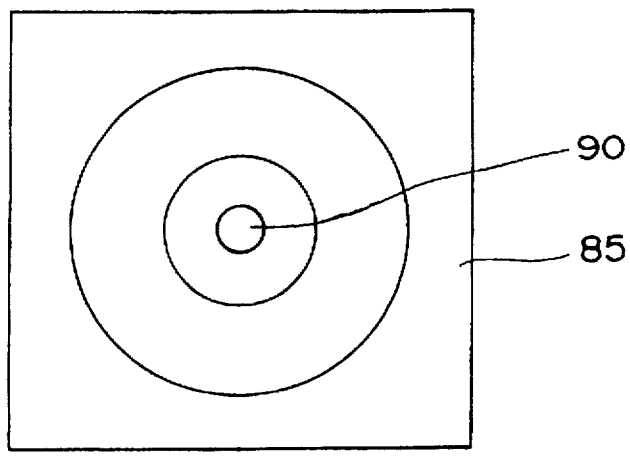
FIG. 10B is a view showing in top plan the light emitting diode.
Figure 11:
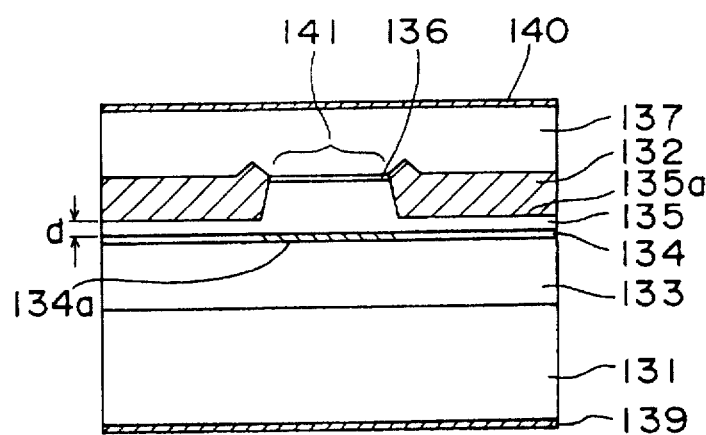
FIG. 11 is a sectional view showing a conventional semiconductor laser device of the effective refractive index guide type.
Figure 12:
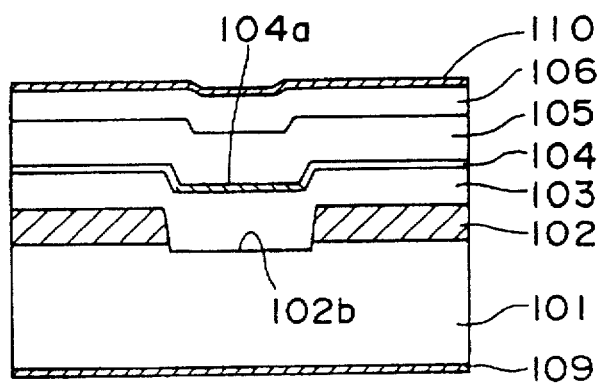
FIG. 12 is a sectional view showing a conventional real refractive index guide type semiconductor laser device.

FIGS. 10A and 10B show a surface-output type light emitting diode representing eighth embodiment of the invention, FIG. 10A being a sectional view, FIG. 10B being a top plan view with respect to FIG. 10A section. This light-emitting diode includes a p-GaAs substrate 81 and, on (111)B face of the p-GaAs substrate 81, an n-GaAs current constrictive layer 82, a p-$(Al_{0.7}Ga_{0.3})_{0.5}In_{0.5}P$ first cladding layer 83, a non-doped $(Al_{0.45}Ga_{0.55})_{0.5}In_{0.5}P$ active layer 84, an n-$(Al_{0.7}Ga_{0.3})_{0.5}In_{0.5}P$ second cladding layer 85, and an n-$Ga_{0.5}In_{0.5}P$ contact layer 86. Shown by 89, 90 are electrodes. A through-channel 82b of a circular pattern is formed centrally in the current constrictive layer 82, and in this through-channel 82b is filled a p-$Al_{0.7}Ga_{0.3}As$ third cladding layer 88. The surface 88a of the cladding layer 88 is flush with the surface 82a of the current constrictive layer 82. A center portion of the cladding layer 85 is worked to a frusto-conical pattern by the ion milling technique.

The current constrictive layer 82, through-channel 82b, and cladding layer 88 are formed in substantially the same way as in the first embodiment. Therefore, the cladding layer 83, active layer 84, and cladding layer 85 which constitute a double heterostructure are formed in a well controlled manner, and this provides for good stability in light emission intensity-applied current characteristics. No etching step is involved after the formation of the cladding layer 88 and, therefore, it is unlikely that any growth interface will become oxidized. Thus, possible current leakage is reduced and light emission intensity is increased. In this way, improvement can be effected with respect to light-emitting diode characteristics. A contact layer 86 and an upper electrode 90 are defined by a small circular pattern disposed on a frusto-conical portion of the cladding layer 85. This provides for increased efficiency of drawing light from the device surface.

A molded package of 5 mm dia. incorporating the light-emitting diode, when energized 20 mA, exhibited a luminous intensity of 4 candela (i. e., conventionally of the order of 0.3 candela) at a wavelength of 555 nm.

In the foregoing embodiments, the GaAs substrate is of the p-type, but it is needless to say that the substrate is not so limited. The GaAs substrate may be of either p-conductivity type or n-conductivity type, and the conductivity type of each respective layer grown may be determined depending upon the conductivity type of the GaAs substrate. The wave band of laser oscillation may be selected from the wave band range of red to orange, by suitably selecting the composition of the AlGaInP active layer. The active layer need not necessarily be non-doped, but may be of the p-type or of the n-type. For the double hetero layer structure, where so required, may be employed an SCH structure (separate confinement heterostructure) including a guide layer as required, or a multiquantum well structure or multiquantum barrier structure. A GaInP or GaAs contact layer may be provided as required. The GaAs substrate need not necessarily be oriented in a just direction insofar as it has (111)B face as a main face, but may be oriented some degrees off in [$\overline{1}$00] or [0$\overline{1}\overline{1}$] directions.

For layer growth after the AlGaAs layer is filled in the current constrictive layer, MOCVD process is preferably employed, but other vapor phase growing methods may be employed instead, including molecular beam epitaxy, atomic layer epitaxy, and chemical beam epitaxy methods.

As is clear from the foregoing description, a semiconductor light-emitting device of the invention includes a substrate having one of p- and n-conductivity types, a current constrictive layer formed on the surface of the substrate and having the other of the p- and n-conductivity types, the current constrictive layer having a through-channel extending to the surface of the substrate in a direction perpendicular to the surface of the substrate for defining a current path extending perpendicularly to the surface of the substrate, and a double heterostructure formed on the current constrictive layer including a first cladding layer, an active layer and a second cladding layer, wherein the through-channel is of a belt-like pattern which extends perpendicularly to the surface of the substrate. Therefore, according to this arrangement, it is possible to provide a refractive index guide type semiconductor laser device. The semiconductor laser device has a third cladding layer of the one conductivity type filled in the through-channel of the current constrictive layer, the surface of the third cladding layer being flush with the surface of the current constrictive layer. The first cladding layer, active layer and second cladding layer which constitute the double heterostructure are formed by a known growth method, for example, MOCVD process, flatly over the current constrictive and third cladding layers in a well-controlled manner, without involving any process of etching. Therefore, the first cladding layer, active layer and second cladding layer involve almost no variation in thickness. This insures better stability in the fundamental mode of laser oscillation, as compared with any conventional semiconductor laser device. The fact that no etching process is involved after the formation of the third cladding layer eliminates the possibility of any growth interface being oxidized. This results in decreased current leakage and lowered oscillation threshold limit. The first cladding layer is usually designed to be relatively thin and in no case does this result in decreased higher-order mode loss. Therefore, good improvement is achieved in kink level. In this way, a semiconductor laser device having improved performance characteristics can be obtained.

Where the third cladding layer has an extended portion covering the surface of the current constrictive layer, the extended portion having a thickness set thinner than the portion filled in the through-channel, the active layer is so formed that it is slightly bent adjacent the edge of the through-channel, when the double heterostructure is formed as by the MOCVD process. As a result, a waveguide arrangement is obtained which has both the characteristic of an effective refractive index guide structure utilizing the light absorption of the substrate (current constrictive layer) and the characteristic of a real refractive index guide structure utilizing the bend of the active layer. This provided for mode loss reduction with respect to the fundamental mode and mode loss enhancement with respect to the higher-order mode, with the result that the fundamental mode is further stabilized.

Where an extension to the current constrictive layer having the other type of conductivity is filled in a peripheral portion of the through-channel, the surface of the extension being flush with the surface of the current constrictive layer, and the third cladding layer is filled internally of the extension to the current constrictive layer within the through-channel, during operation of the device, the width of current injection can be proportionally reduced by the extension to the current constrictive layer. Therefore, the oscillation threshold value is further reduced and, in addition, some astigmatism reduction is achieved.

Where a plurality of through-channels are formed in the current constrictive layer, with the third cladding layers being embedded in the respective through-channels, during operation of the device, a plurality of oscillation regions develop according to the number of current paths formed by the through-channels. This provides a semiconductor laser array.

Where at least one non-through channel is formed in parallel with the through-channel in the current constrictive layer to a depth not greater than the depth of the current constrictive layer, and a fourth cladding layer having the one type of conductivity is filled in the non-through channel, the surface of the fourth cladding layer being flush with the surface of the current constrictive layer, any strain which is exerted upon the active layer because of layers being stacked on the substrate can be distributed over the non-through channel. Thus, the strain applied to the oscillation region over the through-channel can be alleviated so that good improvement is achieved in the long-term reliability of the device.

The semiconductor light-emitting device of an embodiment of the invention includes a substrate having one of p- and n-conductivity types, a current constrictive layer formed on the surface of the substrate and having the other of the p- and n-conductivity types, the current constrictive layer having a through-channel extending to the surface of the substrate in a direction perpendicular to the surface of the substrate for defining a current path extending perpendicularly to the surface of the substrate, and a double heterostructure formed on the current constrictive layer including a first cladding layer, an active layer and a second cladding layer, wherein the through-channel is of a circular pattern. According to this arrangement, it is possible to provide a surface output type light-emitting diode. The light-emitting diode comprises a third cladding layer having the one type of conductivity and filled in the through-channel of the current constrictive layer, the surface of the third cladding layer being flush with the surface of the current constrictive layer. Therefore, the first cladding layer, active layer and second cladding layer which constitute the double heterostructure are formed by a known growth method, for example, MOCVD process, flatly over the current constrictive and third cladding layers in a well-controlled manner, without involving any process of etching. Therefore, the first cladding layer, active layer and second cladding layer involve almost no variation in thickness. This insures good stability in radiation intensity-applied current characteristics. The fact that no etching process is involved after the formation of the third cladding layer eliminates the possibility of any growth interface being oxidized. This results in decreased current leakage and increased light emission intensity. In this way, a light-emitting diode having improved performance characteristics can be obtained.

Where the layers forming the double heterostructure are formed to be frusto-conical, the efficiency of light output of the device can be enhanced.

Also, the substrate is a GaAs substrate having (111)B face or a face offset to the (111)B face which is a main face; the current constrictive layer is comprised of GaAs or AlGaAs; and the third cladding layer is comprised of AlGaAs. In this case, it is possible to grow the third cladding layer comprised of AlGaAs having the one type of conductivity within the through-channel while the substrate is kept at a temperature of not more than 720° C. to fill the through-channel with the third cladding layer in such a manner that the surface of the third cladding layer becomes flush with the surface of the current constrictive layer. Therefore, the first cladding layer, active layer, and second cladding layer which constitute a double heterostructure can be grown by the known growth technique flatly over the current constructive layer and third cladding layer in a well controlled manner.

According to a method of making a semiconductor light-emitting device of an embodiment of the present invention, on a surface of a GaAs substrate having one of p- and n-conductivity types is formed a current constrictive layer comprised of GaAs or AlGaAs and having the other of the p- and n-conductivity types, the substrate surface being (111)B face or a face offset to the (111)B face which is a main face. A through-channel of a predetermined pattern which extends from the surface of the current constrictive layer to the substrate is then formed in the current constrictive layer. Then, a third cladding layer comprised of AlGaAs and having the one type of conductivity is grown within the through-channel while the substrate is kept at a temperature of not more than 720° C. This enables the third cladding layer to be grown so that its surface becomes flush with the surface of the current constrictive layer thereby to fill the through-channel. Therefore, the first cladding layer, active layer, and second cladding layer can be formed flatly over the third cladding layer and current constrictive layer in a well controlled manner to form a double heterostructure. Thus, it is now possible to fabricate semiconductor light-emitting devices, such as semiconductor laser devises and light-emitting diodes, which have improved performance characteristics as compared with conventional devices of the kind.

According to the method of making a semiconductor light-emitting device of an embodiment, after a through-channel is formed in a current constrictive layer, a third cladding layer comprised of AlGaAs and having one type of conductivity is grown while a substrate is kept within a temperature range of 720° C. to 740° C. so as to fill the through-channel in such a manner that a surface of portion of the third cladding layer which fills the through-channel is flush with a surface of the current constrictive layer and that the third cladding layer has an extended portion overlying the surface of the current constrictive layer and being thinner than the fill portion. Therefore, when layers constituting a double heterostructure are formed on the current constrictive layer using, for example, the MOCVD technique, an active layer is formed to be slightly bent adjacent an edge of the through-channel. Thus, the semiconductor light-emitting device made has a waveguide construction featuring both the characteristic of an effective refractive index guide structure utilizing the light absorption of the substrate (current constrictive layer) and the characteristic of a real refractive index guide structure utilizing the bend of the active layer. Therefore, the semiconductor laser device can reduce mode loss relative to the fundamental mode and increase mode loss relative to the higher-order mode, so that the fundamental mode is further stabilized. Furthermore, possible current leaks are reduced and the oscillation threshold limit is lowered.

According to the method of making a semiconductor light-emitting device of an embodiment, an extension to a current constrictive layer which has the other type of conductivity and whose surface is flush with a surface of the current constrictive layer is filled inside a through-channel in the current constrictive layer, and the third cladding layer is filled internally of the extension to the current constrictive layer. Therefore, when the semiconductor light-emitting device thus made is in operation, a width of current injection is proportionally reduced by the extension to the current constrictive layer. With such semiconductor light-emitting device, and semiconductor laser device in particular, therefore, the oscillation threshold value is further reduced and, in addition, some astigmatism reduction is achieved.

According to the method of making a semiconductor light-emitting device of an embodiment, through-channels are formed in plurality in a current constrictive layer, and third cladding layers are filled in respective through-channels. In operation of such a semiconductor light-emitting device, a plurality of oscillation regions develop according to the number of current paths formed by the through-channels. This provides a semiconductor laser array.

According to the method of making a semiconductor light-emitting device of an embodiment, at least one non-through channel having a depth of not more than a depth of a current constrictive layer is provided in parallel with a through-channel in the current constrictive layer, and a fourth cladding layer having the one type of conductivity is embedded in the non-through channel, with a surface of the fourth cladding layer being made flush with a surface of the current constrictive layer. By virtue of this arrangement, any strain exerted on an oscillation region over the through-channel is alleviated so that good improvement can be obtained in the long-term reliability of the device.

According to the method of making a semiconductor light-emitting device of an embodiment, after a through-channel of a circular pattern which extends from a surface of a current constrictive layer to a substrate is formed in the current constrictive layer, a third cladding layer having one type of conductivity is grown within the through-channel while the substrate is kept at a temperature of not more than 720° C., in such a manner that a surface of the third cladding layer is flush with the surface of the current constrictive layer, thereby filling the through-channel. Further, a first cladding layer, an active layer, and a second cladding layer are grown over the current constrictive layer and third cladding layer to form a double heterostructure. Thus, a surface output type light-emitting diode is constructed. In this case, the layers which constitute the double heterostructure are flatly formed by a known growth method, for example, MOCVD process, in a well-controlled manner, without involving any process of etching. Therefore, almost no variation is involved in thickness. This insures good stability in radiation intensity-applied current characteristics. Furthermore, since no etching process is involved after the formation of the third cladding layer, there is no possibility of any growth interface being oxidized. This results in decreased current leakage and increased light emission intensity. In this way, a light-emitting diode having improved performance characteristics can be obtained. Moreover, because of the fact that the layers forming the double heterostructure are formed to be frustoconical, the efficiency of light output of the device can be enhanced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor light-emitting device including a substrate having one of p- and n-conductivity types, a current constrictive layer formed on a surface of the substrate and having the other of the p- and n-conductivity types, the current constrictive layer having at least one through-channel extending to the surface of the substrate for defining a current path in a direction perpendicular to the surface of the substrate, and a double heterostructure formed on the current constrictive layer and including a first cladding layer, an active layer and a second cladding layer, characterized in that:

the through-channel is of a belt-like pattern which extends perpendicularly to end surfaces of the substrate; and the semiconductor light-emitting device comprises a third cladding layer having the one type of conductivity, at least one portion of the third cladding layer being filled in the through-channel, and the at least one portion of the third cladding layer having an upper surface flush with an upper surface of the current constrictive layer.

2. A semiconductor light-emitting device as set forth in claim 1, wherein the third cladding layer has an extended portion covering the surface of the current constrictive layer, the extended portion having a thickness set thinner than that of the portion of the third cladding layer filled in the through-channel.

3. A semiconductor light-emitting device as set forth in claim 1, further comprising an extension to the current constrictive layer having the other type of conductivity and filled in a peripheral portion of the through-channel, the extension having a surface flush with the surface of the current constrictive layer; and the third cladding layer being disposed inward of the extension to the current constrictive layer within the through-channel.

4. A semiconductor light-emitting device as set forth in claim 1, wherein a plurality of the through-channels are formed in the current constrictive layer, the third cladding layer being embedded in each of the through-channels.

5. A semiconductor light-emitting device as set forth in claim 1, further comprising at least one non-through channel formed in parallel with the through-channel in the current constrictive layer to a depth not greater than the depth of the current constrictive layer; and a fourth cladding layer having the one type of conductivity and filled in the non-through channel, the fourth cladding layer having a surface flush with the surface of the current constrictive layer.

6. A surface output type semiconductor including a substrate having one of p- and n-conductivity types, a current constrictive layer formed on a surface of the substrate and having the other of the p- and n-conductivity types, the current constrictive layer having a through-channel extending to the surface of the substrate for defining a current path in a direction perpendicular to the surface of the substrate, and a double heterostructure formed on the current constrictive layer and including a first cladding layer, an active layer and a second cladding layer, characterized in that:

the through-channel is of a circular pattern; and the semiconductor light-emitting device comprises a third cladding layer having the one type of conductivity and filled in the through-channel, the third cladding layer having an upper surface flush with an upper surface of the current constrictive layer.

7. A surface output type semiconductor as set forth in claim 6, wherein the layer forming the double heterostructure is configured to be frusto-conical.

8. A semiconductor light-emitting device as set forth in claim 1, wherein the substrate is a GaAs substrate, the surface of the substrate being (111)B face or a face offset to the (111)B face which is a main face;

the current constrictive layer is comprised of GaAs or AlGaAs; and the third cladding layer is comprised of AlGaAs.

9. A surface output type semiconductor as set forth in claim 6, wherein the substrate is a GaAs substrate, the surface of the substrate being (111)B face or a face offset to the (111)B face which is a main face;

the current constrictive layer is comprised of GaAs or AlGaAs; and the third cladding layer is comprised of AlGaAs.

* * * * *